United States Patent [19]

Mitsuishi et al.

[11] Patent Number: 5,261,110
[45] Date of Patent: Nov. 9, 1993

[54] SYSTEM FOR PERFORMING WRITES TO NON-VOLATILE MEMORY ELEMENTS IN A MINIMAL TIME

[75] Inventors: Naoki Mitsuishi; Toshimasa Kihara; Kiyoshi Matsubara, all of Tokyo, Japan

[73] Assignee: Hitachi, Ltd., Tokyo, Japan

[21] Appl. No.: 418,901

[22] Filed: Oct. 5, 1989

Related U.S. Application Data

[63] Continuation of Ser. No. 88,960, Aug. 24, 1987, abandoned, which is a continuation-in-part of Ser. No. 29,750, Mar. 24, 1987, abandoned.

[30] Foreign Application Priority Data

Oct. 10, 1986 [JP] Japan ............................ 61-251684

[51] Int. Cl.⁵ ................................. G06F 9/06
[52] U.S. Cl. ............... 395/800; 364/DIG. 1; 364/232.8
[58] Field of Search ... 364/200, 900, DIG. 1 MS File, 364/DIG. 2 MS File; 365/189, 230, 233; 395/800

[56] References Cited

U.S. PATENT DOCUMENTS

| | | | |
|---|---|---|---|
| 4,366,540 | 12/1982 | Berglund et al. | 364/200 |
| 4,377,857 | 3/1983 | Tickle | 365/185 |
| 4,520,458 | 5/1985 | Hattori et al. | 364/900 |
| 4,698,750 | 10/1987 | Wilkie et al. | 364/200 |
| 4,701,886 | 10/1987 | Sakakibara et al. | 365/189 |
| 4,718,037 | 1/1988 | Thaden | 364/900 |
| 4,718,038 | 1/1988 | Yoshida | 364/900 |
| 4,752,871 | 6/1988 | Sparks et al. | 364/200 |
| 4,811,294 | 5/1989 | Kobayashi et al. | 365/189 |

OTHER PUBLICATIONS

"Memories, One-Megabit EPROM Invade Disk Territory.", Electronics Week (Apr. 22, 1985), pp. 52-54.
"Large Capacity EPROM-Its Various Direction Great Change Since 1M.", Nikkei Electronics (Aug. 12, 1985), pp. 119-137.
Andrew M. Veronis "Memory". in: Andrew M. Veronis, Microprocessors Hardware and Applications (Reston Va., Prentice-Hall Company (1984), p. 82.
"Single-Chip Mirocomputer", Motorola, Inc., 1984, pp. 3-1033 to 3-1058.

Primary Examiner—Robert B. Harrell
Attorney, Agent, or Firm—Fay, Sharpe, Beall, Fagan, Minnich & McKee

[57] ABSTRACT

A single chip type microcomputer includes at least a central processing unit (CPU), a random-access memory (RAM), a mask read-only memory (mask ROM) and an electrically writable ROM such as an electrically erasable and programmable read-only memory (EEPROM). The electrically writable ROM stores both the user program and data to be preserved. The microcomputer includes further memory for storing a write control program for controlling the write operation to the writable ROM, and the electrically writable ROM and the memory are disposed to mutually different address positions on the address space of CPU. The proportion of size of the user program region and the data region in the writable ROM can be selected in a free proportion. A timer governs writes to the writable ROM.

1 Claim, 4 Drawing Sheets

SYSTEM FOR PERFORMING WRITES TO NON-VOLATILE MEMORY ELEMENTS IN A MINIMAL TIME

This is a continuation of co-pending application, now abandoned, Ser. No. 07/088,960 filed on Aug. 24, 1987 which is a continuation-in-part of U.S. application Ser. No. 029,750, filed on Mar. 24, 1987, now abandoned.

BACKGROUND OF THE INVENTION

The present invention relates to semiconductor integrated circuits, and more particularly to effective technology applicable to a one-chip microcomputer containing a programmable ROM (read only memory) in which an electric write operation can be performed by access from a microprocessor, for example.

An early one-chip microcomputer containing an EPROM (electrically programmable ROM) is exemplified in "Hitachi Microcomputer Data Book, 8-bit single chip" pages 823–865, published by Hitachi, Ltd. in August, 1984. Since the one-chip microcomputer includes EPROM, a user program can rapidly be provided, and can improve adaptability to mass production. That is, if a mask type ROM is used as the incorporated ROM, various masks for forming the program during manufacture may be implemented.

In recent years, so-called IC cards are being used in place of magnetic cards. An earlier one-chip microcomputer containing EEPROM (electrically erasable and programmable ROM) to be utilized in such an IC card or data bank is disclosed in "The Hitachi Hyoron" Vol. 68, No. 7, pages 29–32, published by Hitachi Hyoronsha on Jul. 25, 1986.

In this device, a write operation to the programmable ROM is not performed using the above mentioned writing apparatus. Instead, write operation to the programmable ROM must be performed directly by access from the microprocessor. In such an apparatus, the write operation in a definite time is performed by an incorporated logic circuit, such as oscillation circuit. Since process deviation of the incorporated non-volatile storage element is relatively large, the write time must be set in accordance with the worst case. Therefore, in many cases, additional, unnecessary write time will be spent.

An object of the invention is to provide a semiconductor integrated circuit device, such as a one-chip microcomputer containing a programmable ROM, to enable the write operation rapidly and securely.

The foregoing and other objects and novel features of the invention will be apparent from the description of the specification and the accompanying drawings.

SUMMARY OF THE INVENTION

An outline of a typical example of the invention disclosed in this application will be briefly described as follows:

A programmable ROM performs a write operation by access from the microprocessor, and has a variable write time.

According to the above-mentioned means, the write operation is performed in the minimum time corresponding to a process deviation of the incorporated non-volatile storage element. The write operation can therefore be performed rapidly and securely.

DETAILED DESCRIPTION OF THE INVENTION

Figure 2:
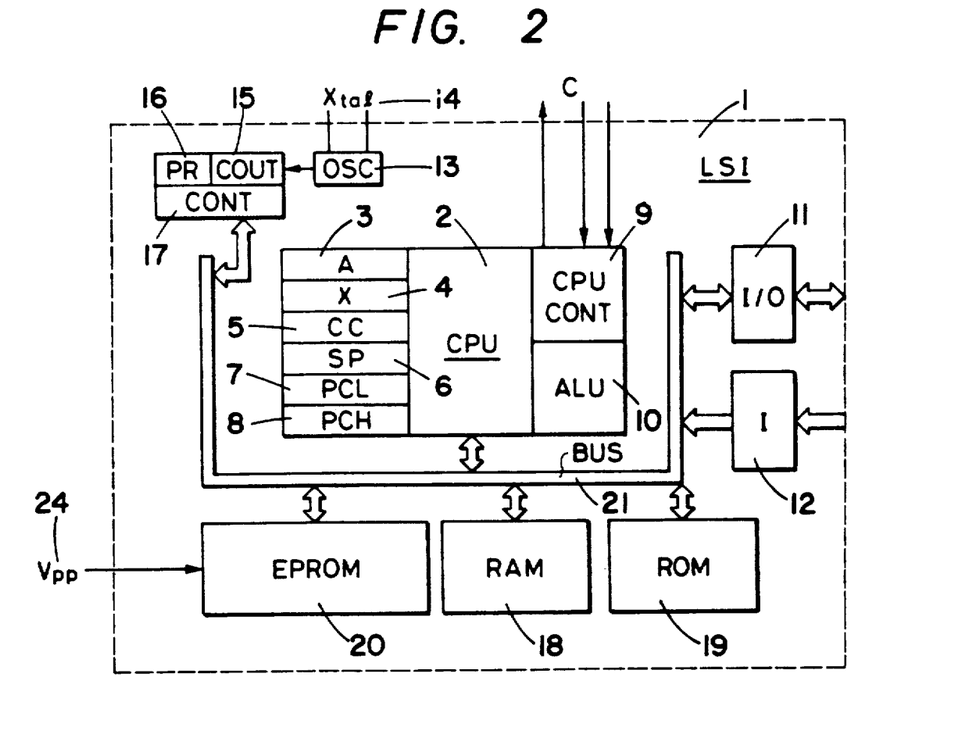
FIG. 2 is a block diagram of an embodiment of a one-chip microcomputer to which the invention is applied.

FIG. 2 is a block diagram of a one-chip microcomputer as one preferred embodiment of the invention.

In FIG. 2, the portion surrounded by a broken line illustrates a semiconductor integrated circuit LSI1, and circuit blocks formed therein illustrate an architecture of the one-chip microcomputer as a whole. The microcomputer is suitably formed on one semiconductor, such as monocrystalline silicon (although not particularly limited thereto) by known manufacturing technology of semiconductor integrated circuits.

Symbol CPU2 designates a microprocessor, and main construction blocks of the microprocessor are exemplified as representative. That is, A3 designates an accumulator, X4 designates an index register, CC5 designates a condition code register, SP6 designates a stack pointer, PCH7, PCL8 designate program counters, CPU-CONT9 designates a CPU controller, and ALU designates an arithmetic logic unit.

Symbol I/O11 designates an input/output port which includes a data transmission directional register inside. Symbol I12 designates an input exclusive port.

Symbol OSC13 designates an oscillation circuit which forms a highly accurate reference frequency signal utilizing an external crystal vibrator Xtal14, although other suitable reference signals are suitable. Clock pulses required in the microprocessor CPU are formed by the reference frequency signal. The reference frequency signal is used also as reference time pulse for a timer. The timer is composed of a counter COUT15, a prescaler PR16 and a controller CONT17.

Symbol RAM18 designates a random access memory which is mainly used as a memory circuit for temporary data storage.

Symbol ROM19 designates a read only memory which is comprised of a mask type ROM, although not particularly limited thereto, and in which programs for processing various informations are written. The programs include a data write program for writing an EPROM20 as will hereinafter be described.

Symbol EPROM designates an erasable and programmable ROM which is used mainly for storing important data to be held. For example, in an IC card for bank records, data such as receipt/payment data, or in an IC card for medical treatment records, data such as consultation data, such as a clinical chart may be stored.

The above mentioned circuit blocks are connected to each other about the centrally positioned microprocessor CPU by a bus BUS21. The bus BUS includes a data bus DAT22 and an address bus ADD23 (FIG. 1) as hereinafter described. Control signals to each memory and peripheral circuit are not shown.

In this embodiment, when a write high voltage Vpp24 of about 12 V or 21 V is supplied from the external terminal, the EPROM20 receives address and data produced by the microprocessor and control signal commanding the write operation so that the write operation is performed. In the writing circuit for performing the write operation, the write time is variable.

If data written in the EPROM20 need not be erased in the integrated circuit LSI of this embodiment, the whole device is sealed by a plastic package. On the contrary, if the data should be erasable, a window for ultraviolet irradiation is provided at portion where the EPROM20 is formed.

In a new EPROM, data at all locations is fixed to either "1" or "0" by the particular manufacturing method of the semiconductor element. Data at the initial state, i.e. the erase state, is assumed herein to be a "1" for purposes of the following illustrations only.

Figure 1:
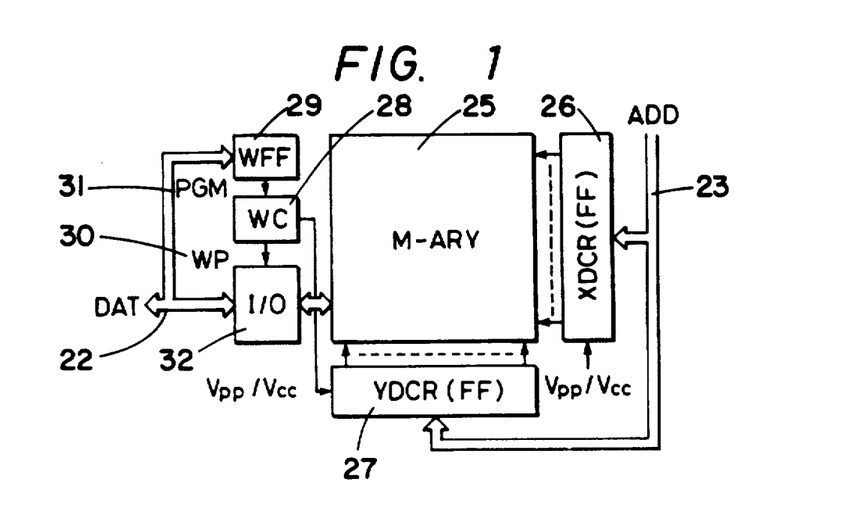
FIG. 1 is a block diagram of an embodiment of EPROM with the write time being variable.

FIG. 1 is a block diagram of an embodiment of a suitable EPROM20 of FIG. 2 having a variable duration or write time.

A memory array M-ARY25 is constructed of a matrix arrangement of non-volatile storage elements of stack gate structure, having floating gates and control gates (hereinafter referred to as "stack gate transistors"). Control gates of these stack gate transistors arranged on the same row are connected commonly to a corresponding word line, and drain electrodes of the transistors arranged on the same column are connected to a corresponding data line (digit line or bit line).

One word line of the memory array M-ARY is selected by an X address decoder X-DCR26. That is, the X address decoder X-DCR26 has a latch circuit FF so that an address signal supplied through the address bus ADD23 is held in the latch circuit FF. Then the X address decoder X-DCR 26 decodes the address signal, and sets one word line in a selective state.

One data line of the memory array M-ARY 25 is selected by a Y address decoder Y-DCR 27. That is, the Y address decoder Y-DCR 27 has a latch circuit FF being similar to X-DCR 26 so that an address signal supplied through the address bus ADD 23 is held in the latch circuit FF. Then the Y address decoder Y-DCR 27 decodes the address signal, and a column switch MOSFET connecting the data line to the common data line is turned on. If the write mode is commanded when the high voltage Vpp is supplied, the address decoders X-DCR 26, Y-DCR 27 form the selective signal of a high voltage level according to the high voltage Vpp. On the contrary, if the read mode is commanded, the address decoders X-DCR 26, Y-DCR 27 form the selective signal of ordinary level according to relatively low voltage Vcc being about 5 V. Changing of the voltage Vpp/Vcc is performed by a write control circuit WC 28 as hereinafter described.

The above mentioned common data line is connected to the data bus DAT 22 through an input/output circuit I/O 32. For example, during a read operation, the output circuit is enabled and transmits data of the common data line to the data bus DAT 22. During a write operation, the input circuit is enabled. If during a write operation data on a conductor of the data bus DAT 22 is a logic "0", the input circuit converts the data into the high voltage Vpp and transmits the converted data to the common data line. If the data is a logic "1", the input circuit transmits the ground potential level of the circuit to the common data line. The input circuit has a latch circuit similar to that of the address decoder, and holds the write data on the data bus DAT 22.

The write signal from the microprocessor CPU sets a write flag WFF 29. While the WFF 29 is set and the output signal PGM 31 is made high, the write control circuit WC 28 converts the voltage into a high voltage Vpp. Also the write control circuit WC 28 transmits the write signal WP 30 to the input circuit of the input/output I/O 32. In this construction, if the corresponding write bit is a logic "0", the input circuit makes the output the high voltage Vpp. If the write bit is logic "1", the input circuit makes it the ground level of the circuit. Consequently, the write time is made variable according to set/reset of the write flag WFF 29 by the microprocessor CPU. That is, the microprocessor CPU supplies the decoders X-DCR 26, Y-DCR 27 of the EPROM with the specific address signal in the address space allocated to the EPROM through the address bus ADD 23, and also supplies the input circuit with the data to be written through the data bus DAT 22. The write flag WFF 29 is set in this state. Since the signal PGM 31 is made high and the high voltage Vpp is supplied to the decoders X-DCR 26, Y-DCR 27 and the input circuit, the EPROM starts the write operation. While the flag WFF 29 is set, the decoders X-DCR 26, Y-DCR 27 and the input circuit hold respective address signal and data. Utilizing the incorporated timer circuit shown in FIG. 2 or according to program having a prescribed timer function, the write flag WFF 29 is reset after lapse of the definite time. Thus, the write operation of the EPROM is finished. The write time of the EPROM can be set to any value by the time setting according to the incorporated timer circuit or the timer program.

Figure 3:
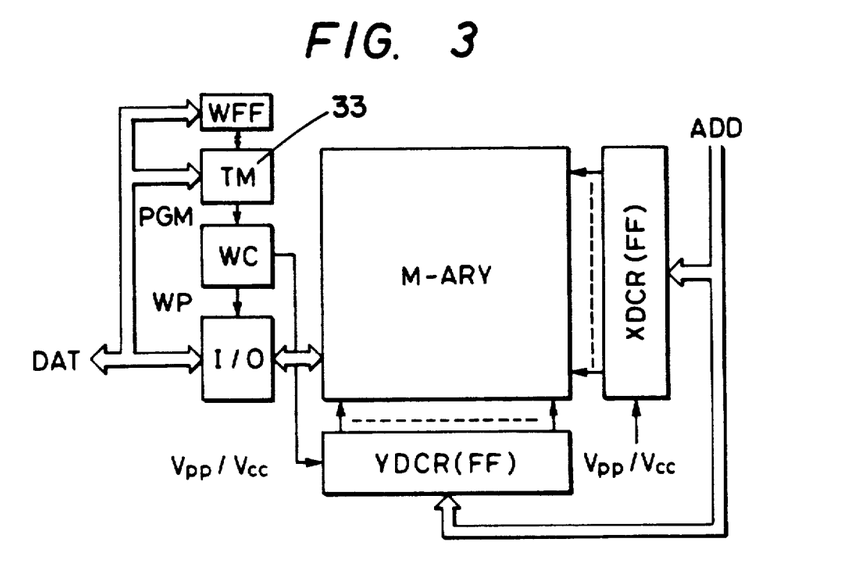
FIG. 3 is a block diagram of another embodiment of EPROM with the write time being variable.

FIG. 3 is a block diagram of another embodiment of an EPROM having a function of the write time being variable.

In the case of the writing circuit shown in FIG. 1, since the microprocessor CPU directly controls the write time of the EPROM, other information processing cannot be performed during the time, or at least the information processing efficiency is significantly deteriorated. Although use of the incorporated timer circuit can reduce the deterioration of the information processing efficiency, the hardware resources cannot be effectively utilized, particularly in applications where an EPROM write frequency is high. If the write flag is set by mistake, due to runaway of the program or the like, the mistake write may be produced to the EPROM or the write flag may be left in set state resulting in breakage of the storage element due to the excessive write.

Consequently, the writing circuit shown in FIG. 3 is provided with a dedicated timer circuit TM 33. The microprocessor CPU need only set the write time information for the timer circuit TM. The timer circuit TM 33 entirely controls the write time to the EPROM. Thereby the microprocessor CPU is free to perform other information processing operations during the write operation of the EPROM.

Figure 4:
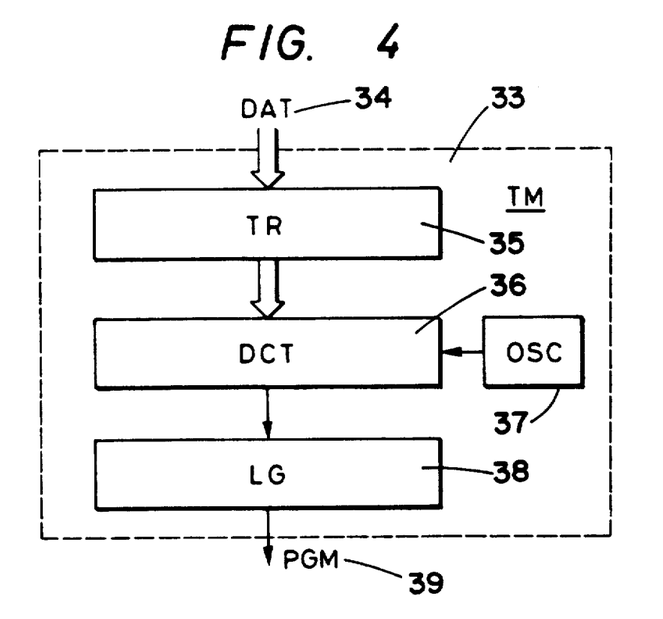
FIG. 4 is a block diagram of an embodiment of a timer circuit thereof.

FIG. 4 is a block diagram of an embodiment of a timer circuit TM 33 of FIG. 3.

Time information is written from the microprocessor CPU through the data bus DAT 34 into the time register TR 35. A down counter DCT 36 is started by the microprocessor CPU in response to control signal (not shown) and the time information is set as initial value.

The down counter DCT 36 performs a count of pulse signals formed by an oscillation circuit OSC 37. Thereby output signal PGM of a logic circuit LG 38 is made high, and the write operation is started in a similar manner to that described above. The logic circuit LG 38 detects a zero of the count value of the down counter DCT 36, and converts the write signal PGM 39 from a high level to a low level. Thus, the write operation of the EPROM is performed according to the time set by the timer circuit TM 33. For example, if the oscillation period of the oscillation circuit OSC 37 is T, value 100 (decimal notation) is set to the time register TR 35, the write time becomes $100 \times T$. In this construction, any write time can be set according to period of the count signal supplied to the time register TR 35 and the oscillation signal. Starting of the write is performed by setting the flag WFF although not particularly limited thereto. The flag WFF is cleared after the write is finished.

In a microcomputer as shown in this embodiment, where the oscillation circuit is installed in addition to the timer circuit of the microcomputer, the clock is made variable. The definite write time can be set without being affected by the clock frequency.

Figure 5:
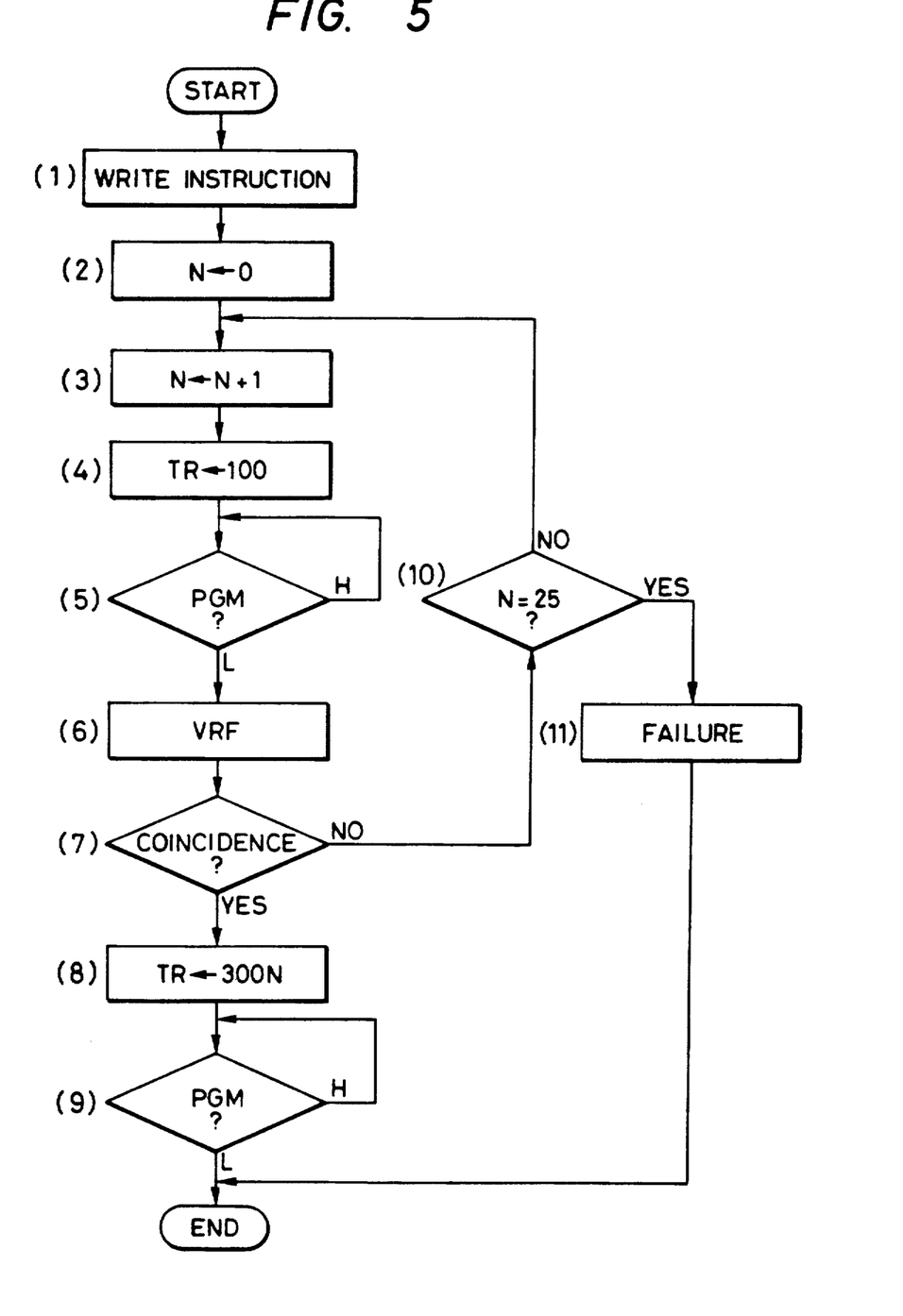
FIG. 5 is a flow chart illustrating a high-speed write algorithm.

FIG. 5 is a flow chart illustrating an example of a high-speed write algorithm using the writing circuit shown in FIG. 3.

In step (1), the microprocessor CPU executes a write instruction to the EPROM, and supplies the EPROM with an address signal and a write data signal through the address bus ADD and the data bus DAT, respectively. The EPROM holds these signals in the latch circuit. In step (2), the CPU further clears content of the specific register (N←0). In step (3), addition of +1 is performed to the register (N←N+1). In step (4), unit write time is written into the time register TR. For example, the oscillation period of the oscillation circuit OSC is made 1 and the count value is set to 100 (decimal notation). Thereby the unit time becomes 100 μs.

In step (5), the write operation of 100 is performed. The CPU is free to perform other processing during this period. If the write signal PGM is converted from a high level to a low level, the microprocessor CPU is interrupted and a verify mode is commanded in step (6). Thereby a read operation of the EPROM is performed, and a decision is rendered regarding whether the read data of the non-volatile storage element corresponding to the write data of logic "0" becomes "0" or not. If a decision of coincidence in step (7) is NO, a decision in step (10) is rendered regarding whether or not value N of the register is 25. If the value N is 24 or less, the process is returned to step (3). Thereby the write operation of 100 is performed again. If the unit write operation is performed 25 times, the storage element is concluded to be faulty in step (11), and the write operation is ended. That is, if the write operation of logic "0" is impossible, even spending the write time of total 2.5 ms, a failure is rendered and the operation is ended.

If the write of logic "0" is concluded in step (7), the microprocessor CPU calculates $300 \times N$ in step (8), and the result is set to the time register TR and an overlapped write operation is performed. That is, the overlapped write is performed in three times of 100N is required for the write operation of logic "0". When the overlapped write is finished, the write signal PGM becomes low level in step (9) and the microprocessor CPU is interrupted. Thus, the data write operation in the unit (e.g. one byte) is finished, and process is transferred to next write cycle or other information processing. The high-speed write algorithm as above described is performed according to program written in the ROM although not particularly limited thereto.

Figure 6:
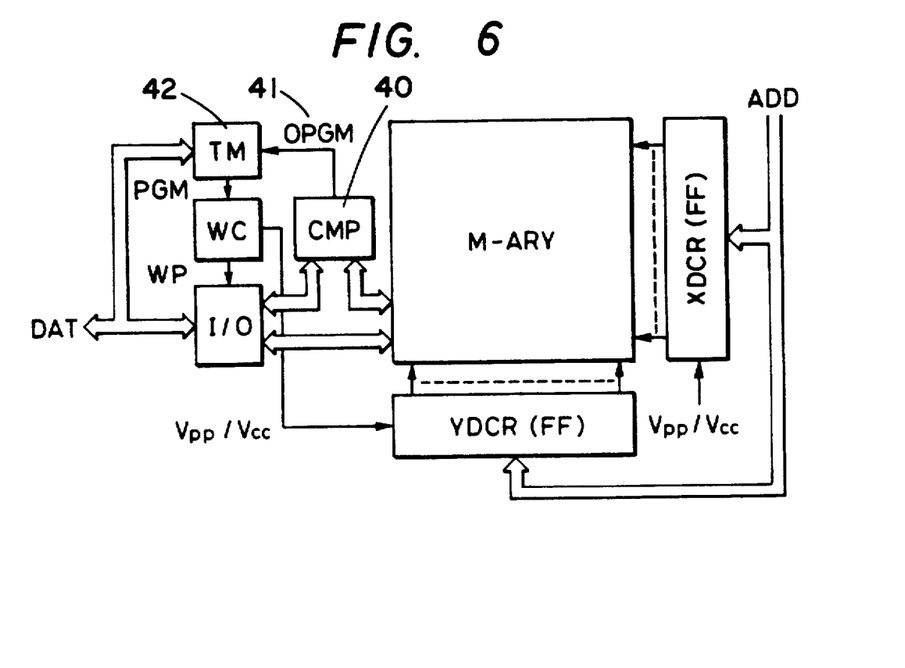
FIG. 6 is a block diagram of a further embodiment of EPROM with a variable write time.

FIG. 6 is a block diagram of an embodiment including a logic circuit for implementing the high-speed write algorithm shown in FIG. 5.

FIG. 6 further includes a comparator CMP 40. The comparator CMP performs the read operation of the EPROM in synchronization with variation of the write signal PGM from a high level to a low level, and further compares the content with the write data latched in the input circuit. If the result is coincident, the overlapped write signal OPGM 41 becomes high level thereby the overlapped write is commanded to a timer circuit TM 42.

Figure 7:
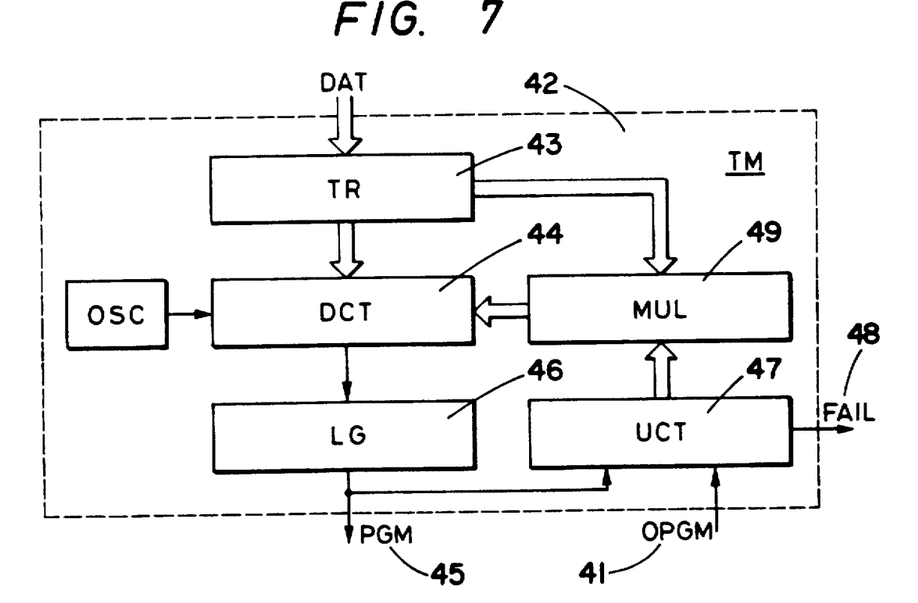
FIG. 7 is a block diagram of an embodiment of a timer circuit.

FIG. 7 is a block diagram of an embodiment of the timer circuit TM 42.

If the timer circuit TM 42 is started by the microprocessor CPU according to a control signal (not shown), the content of a time register TR 43 is set to an initial value for a down counter DCT 44 which starts the count operation. Thereby output signal PGM 45 of a logic circuit LG 46 is made high and the write operation is started. The logic circuit LG 46 detects a zero of the count value of the down counter DCT 44, and converts the write signal PGM 45 from a high level to a low level at that time.

Then the comparator CMP 40 performs the verify operation. If the result is not coincident, an overlapped write signal OPGM 41 is low. In this case, the content of the time register TR 43 is set to the down counter DCT 44, and the ation is repeated in similar manner to the above description.

An up counter UCT 47 detects variation of the write signal PGM 45 from a high level to a low level, and performs the count operation of the variation. Even though content of the up counter UCT 47 is coincident to prescribed value, e.g., 25, if overlapped write flag OPGM 41 remains low, a write failure is determined and the write failure flag FAIL 48 is set. Then the down counter DCT 44, the up counter UCT 47 and the latch circuit are cleared. Thus, the whole write operation is finished.

If the overlapped write flag OPGM 41 becomes high, a multiplier MUL 49 multiplies content of the time register TR 43 by content of the up counter UCT 47 at this time. The multiplier MUL 49 further multiplies the result by three, for example, and the overlapped write time information is produced and set as initial value to the down counter DCT 44. Thus, the write operation is started in similar manner to the above description. The overlapped write flag OPGM 41 is held during this period. If the overlapped write is finished in this state and the write signal PGM 45 is varied from a high level to a low level, the down counter DCT 44, the up counter UCT 47 and the latch circuit are cleared thus the overlapped write operation is finished.

According to the above described method, the high speed write algorithm shown in FIG. 5 can be executed without applying any burden to the software. That is, at the write of the EPROM, the microprocessor CPU need only generate the starting signal to the assigning of the write address and the write data and writing circuit and can perform the write operation similarly to write to the RAM. Thereby deterioration of the information processing efficiency of the microprocessor CPU can be prevented.

Also in this case, it is preferable that the unit write time, the overlapped write time and the information of a failure decision can be assigned from the microprocessor CPU. For example, the time register TR after reset may only be assigned by the microprocessor CPU. Or prescribed value in hardware fashion may be written into the time register TR43 at reset.

In the high-speed write algorithm as above described, the write operation can be performed securely and rapidly at the minimum time corresponding to deviation of the individual element's characteristics.

Setting of the write time in the writing circuit having the write variable function of FIG. 1 or FIG. 3 may be performed by the write time measured by the manufacturer. Alternately, when the write method of FIG. 5 is adopted, a mean value of N may be determined by the user and the write time may be set based on the mean value of N. Since deterioration of write characteristics of the element is produced by repetition of write/erase, the write time or the overlapped write time may be lengthened corresponding to the number of repeated writes. When reliability of the memory holding is not strictly required in certain uses, particularly when the write cycle must be finished in a short time on account of the large amount of data to be written, the write time or the overlapped write time may be set to minimum.

The write time information may be written in a specific address of the EPROM, and the read operation of the specific address may be performed before starting on the write operation and the write time may be set automatically based on the read operation of the specific data. For example, if the count value of the time register TR35 in FIG. 4 or value of N to be set in the register is written in the specific address of the EPROM, the write time depending on the above-mentioned value can be set automatically.

In the storage elements formed on the same semiconductor substrate, the write characteristics may be different from each other in range of about 100 times. That is, the maximum time required for the write operation may be 100 times as large as the minimum time. For example, assume that the assured value of the write time is 10 ms. During the test, in the circuit of the embodiment of FIG. 3, the write operation of 100 is first performed, and the written element is decided passable and the remaining elements are further subjected to the write operation of 100 and a similar decision is performed. Subsequently, the write operation is performed at 200, 400, 800, 1600 and 3200 in sequence, and a similar decision is performed. When the write operation of 3200 is finished, the total write time becomes 6.4 ms and the elements being not yet written are determined to be defective so as to secure the margin to the assured value. In the embodiment of FIG. 3, since such a method is implemented, the test time can be reduced effectively. Particularly, when the self diagnosis is performed by the software during actual use, the above mentioned test method is more effective. Also during actual use, the write processing flow as above described may be adopted. The write processing flow as above described can also be implemented by the logic circuit of FIG. 6.

Effects obtained from the above mentioned embodiments are as follows:

(1) Since the write operation is performed by access from the microprocessor and the write time of the programmable ROM is variable, the write operation can be performed at the minimum and optimum time corresponding to individual process deviations of each incorporated non-volatile storage element. Thereby the write operation may be implemented rapidly and securely.

(2) In order to make the write time variable, a flag to be set/reset by the microprocessor is used. The high-speed write operation is thereby implemented in a simple construction.

(3) In order to make the write time variable, the time setting is performed by the timer circuit, including the counter circuit, to perform the count operation of prescribed periodic pulse signals according to the count information assigned from the microprocessor. In this construction, the microprocessor need only set the write time information to the timer circuit, and then the timer circuit entirely controls the write time. Thereby the microprocessor is freed to perform other information processing during the write operation.

(4) The timer circuit is provided with an oscillation circuit separate from the timer circuit of the microprocessor. Consequently, even in the microcomputer with a variable clock time, a definite write time can be set without being affected by frequency of the clock.

(5) After the write operation in the unit time set by the timer circuit, the verify operation of the programmable ROM is performed. The write operation is continued over a plurality of unit times until the prescribed write signal is written, and then the overlapped write is performed by the present time. Thereby the write operation can be performed rapidly and securely corresponding to deviation of the element characteristics.

(6) If the logic circuit to implement the write operation is incorporated in the write circuit, the write operation can be performed rapidly and securely without deteriorating the information processing efficiency of the microprocessor.

The present invention has been described with certain preferred embodiments. However, the invention is not limited to these embodiments, and various modifications may be made, of course, without departing from the spirit of the invention. For example, the non-volatile storage elements may be not only the stack gate transistor variety, but also EEPROM (being erasable electrically) using MNOS (metal nitride oxide semiconductor) transistors, or FLOTOX (floating gate tunneling oxide) transistors. When the EEPROM is used, the bootstrap circuit for generating the write high-voltage Vpp may be incorporated. Concrete circuits in each circuit block may be any circuit as long as it performs a similar operation to that of the above description.

The invention includes programmable ROM to enable the write operation electrically and a microprocessor to perform the write operation of the programmable ROM. Consequently, the invention can be widely utilized in semiconductor integrated circuits for various IC cards, data bank, or the like, which have the function of a microcomputer.

Having thus described the preferred embodiment, it is now claimed:

1. A one-chip microcomputer for use in an IC card, the one-chip microcomputer including a microprocessor for executing a predetermined data processing in accordance with a program and an electrically programmable read only memory, the one-chip microcomputer comprising:

a bus;

the microcomputer being coupled to the bus; a read only memory, coupled to the bus, for storing the program therein, the program including a data processing program and a data write program for writing data to the electrically programmable read only memory;

the electrically programmable read only memory being coupled to the bus and having a read mode, a write mode and a verify mode, wherein in the read mode the electrically programmable read only memory receives an address signal provided from the microprocessor executing the data processing program via the bus and provides data to the bus, wherein it the write mode the electrically programmable read only memory receives an address signal and data which are provided from the microprocessor executing the data write program via the bus to write the data into the electrically programmable read only memory, wherein in the verify mode the electronically programmable read only memory is accessed by the address signal which the microprocessor provides in the write mode of the electronically programmable read only memory to read out data from addresses of the electrically programmable read only memory assigned by the address signal, and wherein the electrically programmable read only memory includes an input circuit coupled to the bus for latching the data to be written into the electrically programmable read only memory;

a compare circuit coupled to the input circuit for comparing the data latched in the input circuit and the data read out from the electrically programmable read only memory in the verify mode, wherein the compare circuit provides a result signal having a first level when the data latched in the input circuit is coincident with the data read out from the electrically programmable read only memory, and having a second level when the data latched in the input circuit is not coincident with the data read out from the electrically programmable read only memory; and a timer circuit including:
an oscillation circuit for producing pulse signals having a predetermined frequency;
a time register coupled to the bus for storing a time information provided from the microprocessor executing the data write program;

a first counter coupled to receive the pulse signals and to the time register and responsive to reception of a control signal provided from the microprocessor executing the data write program for starting count operations of the pulse signals, the first counter performing the count operations until count times indicated by the time information in the time register, wherein the count operation of the first counter is repeated when the result signal is in the second level;

a logic circuit coupled to the first counter and to the electrically programmable read only memory for providing a write signal having a first level to the electrically programmable read only memory when the first counter performs the count operations, and having a second level to the electrically programmable read only memory when the first counter does not perform the count operations, where the write signal of the first level enables the write mode of the electrically programmable read only memory, and the write signal of the second level enables the verify mode of the electrically programmable read only memory, wherein the compare circuit performs a compare operation in response to the write signal changing from the first level to the second level;

a second counter coupled to receive the write signal for counting variation of the write signal from first level to the second level; and a multiplier coupled to the first and second counter and to the time register and responsive to the result signal having the first level for providing to the first counter an overlapped write time information more than value obtained by multiplying the time information of the time register by content of the second counter, wherein the first counter performs count operation until count times indicated by the overlapped write time information, instead of the count times indicated by the time information in the time register, so that the write operation of the data latched in the input circuit to the electrically programmable read only memory is started according to the overlapped write time information.

* * * * *

UNITED STATES PATENT AND TRADEMARK OFFICE
CERTIFICATE OF CORRECTION

PATENT NO. : 5,261,110

DATED : November 9, 1993

INVENTOR(S) : Naoki Mitsuishi, et al.

It is certified that error appears in the above-identified patent and that said Letters Patent is hereby corrected as shown below:

Claim 1, column 9, line 11, delete "it" and substitute therefor --in--.

Signed and Sealed this

Twelfth Day of April, 1994

Attest:

BRUCE LEHMAN

*Attesting Officer*  *Commissioner of Patents and Trademarks*